(12) United States Patent
Chou et al.

(10) Patent No.: US 10,014,242 B2
(45) Date of Patent: Jul. 3, 2018

(54) INTERPOSER SUBSTRATE AND METHOD OF FABRICATING THE SAME

(71) Applicant: PHOENIX PIONEER TECHNOLOGY CO., LTD, Hsinchu County (TW)

(72) Inventors: Pao-Hung Chou, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 14/706,101

(22) Filed: May 7, 2015

(65) Prior Publication Data
US 2016/0163626 A1 Jun. 9, 2016

(30) Foreign Application Priority Data

Dec. 3, 2014 (CN) .......................... 2014 1 0726850

(51) Int. Cl.
*H05K 1/02* (2006.01)
*H05K 1/11* (2006.01)
(Continued)

(52) U.S. Cl.
CPC .... *H01L 23/49822* (2013.01); *H01L 21/4857* (2013.01); *H01L 21/6835* (2013.01);
(Continued)

(58) Field of Classification Search
CPC ........... H01L 23/49822; H01L 21/4857; H01L 23/49838; H01L 21/6835; H01L 2221/68345; H01L 2221/68359; H01L 24/50; H05K 1/111; H05K 3/46; H05K 3/40; H05K 3/061; H05K 1/0254; H05K 1/0256; H05K 1/0257; H05K 1/0259; H05K 1/026; H05K 1/0263; H05K 1/0265; H05K 1/0278; H05K 1/0284; H05K 1/0296; H05K 1/0298; H05K 1/036; H05K 1/0366;
(Continued)

(56) References Cited

U.S. PATENT DOCUMENTS 5,841,194 A * 11/1998 Tsukamoto ........... H01L 23/145
257/668
7,060,604 B2 * 6/2006 Kata .................... H01L 21/4857
257/701
(Continued)

*Primary Examiner* — Ishwarbhai B Patel
(74) *Attorney, Agent, or Firm* — Amin, Turocy & Watson LLP

(57) ABSTRACT

The invention provides an interposer substrate and a method of fabricating the same. The method includes: etching a carrier to form a recessed groove thereon; filling a dielectric material in the recessed groove to form a first dielectric material layer, or forming a patterned first dielectric material layer on the carrier; forming a first wiring layer, a first conductive block and a second dielectric material layer on the carrier and the first dielectric material layer sequentially, with the first wiring layer and the first conductive block embedded in the second dielectric material layer; and forming a second wiring layer and a second conductive block on the second dielectric material layer. A coreless interposer substrate having fine pitches is thus fabricated.

3 Claims, 9 Drawing Sheets

(51) Int. Cl.
*H05K 3/40* (2006.01)
*H01L 23/498* (2006.01)
*H01L 21/48* (2006.01)
*H01L 21/683* (2006.01)
*H01L 23/13* (2006.01)
*H05K 3/06* (2006.01)

(52) U.S. Cl.
CPC ........... *H01L 23/13* (2013.01); *H05K 1/0296* (2013.01); *H05K 1/111* (2013.01); *H01L 21/486* (2013.01); *H01L 23/49827* (2013.01); *H01L 2221/68345* (2013.01); *H01L 2224/16225* (2013.01); *H01L 2224/32225* (2013.01); *H01L 2224/48091* (2013.01); *H01L 2224/73204* (2013.01); *H01L 2924/15311* (2013.01); *H01L 2924/181* (2013.01); *H05K 1/0284* (2013.01); *H05K 3/061* (2013.01); *H05K 3/40* (2013.01); *H05K 2201/10378* (2013.01)

(58) Field of Classification Search
CPC ...... H05K 1/0373; H05K 1/0393; H05K 1/05; H05K 1/11; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253; H05K 1/114; H05K 1/117; H05K 1/119; H05K 1/14; H05K 1/142; H05K 2201/09872; H05K 2201/10378; H05K 1/0277; H05K 1/0281; H05K 1/0283; H05K 1/118; H05K 1/147; H05K 1/148; H05K 1/189; H05K 2201/042; H05K 2201/046; H05K 2201/05

See application file for complete search history.

(56) References Cited

U.S. PATENT DOCUMENTS

| | | | | |
|---|---|---|---|---|
| 8,227,711 | B2* | 7/2012 | Hsu | H05K 3/4007 174/262 |
| 8,609,995 | B2* | 12/2013 | Maeda | H05K 3/0035 174/251 |
| 8,800,142 | B2* | 8/2014 | Nang | B23K 1/0016 29/852 |
| 2003/0161129 | A1* | 8/2003 | Kusano | H01L 23/4985 361/795 |
| 2006/0273816 | A1* | 12/2006 | Hsu | G01R 1/0483 174/255 |
| 2013/0008705 | A1* | 1/2013 | Tseng | H05K 1/111 174/266 |
| 2013/0098670 | A1* | 4/2013 | Inoue | H05K 3/4007 174/264 |
| 2013/0168144 | A1* | 7/2013 | Jeong | H05K 3/4007 174/257 |
| 2014/0332253 | A1* | 11/2014 | Lin | H05K 3/0097 174/251 |

\* cited by examiner

INTERPOSER SUBSTRATE AND METHOD OF FABRICATING THE SAME

BACKGROUND OF THE INVENTION

1. Field of the Invention

The present invention relates to interposer substrates, and, more particularly, to an interposer substrate and a method of fabricating the interposer substrate.

2. Description of Related Art

With the development in miniaturization for semiconductor packages, a typical printed circuit board (PCB) has smaller surface available to accommodate semiconductor packages. Therefore, a Package on Package (PoP) is developed having multiple packaging structures, each being stacked on top of the other in order to meet the high density requirement.

Traditional stacked packages are formed by stacking a semiconductor package via a plurality of solder balls such that it is electrically connected to another semiconductor package. However due to the limitation of the fabricating process, a certain size and distance must remain for the solder balls, as a result, the electrical external connection points would be reduced as only a limited area of the package is available, which leads to an increase in thickness of the overall package structure.

Referring to FIG. 1, in order to increase I/O number and meet the low-profile and compact-size requirements for the stacked package structures, an interposer substrate 10 is provided between a first semiconductor package 1A and a second semiconductor package 1B, and a first wiring layer 11 and a second wiring layer 12 are formed on the first surface and second surface of the interposer 10, respectively. The interposer substrate 10 has conductive vias 13 for electrically connecting the first wiring layer 11 with the second wiring layer 12.

FIGS. 2A-2F illustrate a method of fabricating an interposer substrate.

As shown in FIG. 2A, a core board 20 is provided. The core board 20 has a first surface 20a and an opposing second surface 20b. A plurality of vias 20c are formed on the core board 20 and penetrate the first and second surfaces 20a and 20b. A metal layer 21 is plated on the first surface 20a, the second surface 20b and the vias 20c of the core board 20.

As shown in FIG. 2B, the metal layer 21 on the first surface 20a and second surface 20b are patterned to form the first wiring layer 21a and second wiring layer 21b that are electrically connected through the metal layer in the vias (i.e., the conductive vias 21c). An insulating layer (a solder mask layer) 22 is formed on the first wiring layer 21a and the second wiring layer 21b, and a plurality of openings are formed on the insulating layer to expose a portion of the first wiring layer 21a and the second wiring layer 21b.

As shown in FIG. 2C, a conductive layer 23 and a resist layer 24 are formed on the insulating layer 22 of the first surface 20a and the second surface 20b of the core board 20.

As shown in FIG. 2D, the resist layer 24 is patterned to form a plurality of openings to expose a portion of the second wiring layer 21b. An electroplating process is performed to form in the openings of the resist layer 24 a conductive material that is electrically connected with the second wiring layer 21b.

As shown in FIG. 2E, the resist layer 24 and the conductive layer 23 covered by the resist layer 24 are removed to form an interposer substrate.

However, the method is complex and the cost thereof is high. The additionally disposed conductive layer is likely to deteriorate the electrical performance of the interposer substrate. In addition, the thickness of the interposer substrate is also limited, such that when the thickness is smaller (such as under 130 µm), it is difficult to be fabricated and damages could easily occur. Further the design of the wiring would be limited by, the line width/line space (L/S). The yield may be influenced when L/S is lower than 25/25 µm.

Hence, there is an urgent need to solve the foregoing problems encountered in the prior art.

SUMMARY OF THE INVENTION

In view of the foregoing drawbacks, the present invention provides a method of fabricating an interposer substrate, comprising: forming a plurality of recessed grooves on a carrier, and forming a first dielectric material layer in the recessed grooves; forming a first wiring layer on the carrier and the first dielectric material layer; forming a plurality of first conductive blocks on the first wiring layer; covering the first wiring layer and the first conductive blocks with a second dielectric material layer, with terminal portions of the first conductive blocks exposed from the second dielectric material layer; forming on the second dielectric material layer a second wiring layer that is electrically connected with the first conductive blocks; forming second conductive blocks on the second wiring layer; and removing the carrier.

The present invention provides an interposer substrate, comprising: a second dielectric material layer having opposing first and second surfaces; a first wiring layer embedded in the second dielectric material layer and having a first surface flush with the first surface of the second dielectric material layer and a second surface opposing to the first surface of the first wiring layer; a first dielectric material layer formed on the first surface of the second dielectric material layer and having a plurality of openings, from which a portion of the first wiring layer is exposed; a plurality of first conductive blocks embedded in the second dielectric material layer and having first terminal surfaces connected to the second surface of the first wiring layer and second terminal surfaces opposing to the first terminal surfaces and flush with the second surface of the dielectric material layer; a second wiring layer formed on the second surface of the second dielectric material layer and having a first surface connected to the second terminal surfaces of the first conductive blocks and a second surface opposing to the first surface of the second wiring layer; and a plurality of second conductive blocks formed on the second surface of the second wiring layer.

The present invention provides a method of fabricating an interposer substrate, comprising: forming on a carrier a first dielectric material layer that has a plurality of openings, from which the carrier is exposed; forming a first wiring layer on the carrier and the first dielectric material, with a first portion of the first wiring layer formed in the openings of the first dielectric material layer and a second portion the first wiring layer formed on the first dielectric material layer; forming a plurality of first conductive blocks on the first wiring layer; covering the first dielectric material layer, the first wiring layer and the first conductive blocks with a second dielectric material layer, with terminal portions of the first conductive blocks exposed from the second dielectric material layer; forming on the second dielectric material layer a second wiring layer that is electrically connected with the first conductive blocks; forming a plurality of second conductive blocks on the second wiring layer; and removing the carrier.

The present invention provides an interposer substrate, comprising: a first dielectric material layer having opposing first and second surfaces and a plurality of openings penetrating the first and second surfaces; a first wiring layer having a first portion formed on the second surface of the first dielectric material layer and a second portion formed in the openings of the first dielectric material layer and exposed from the first surface of the first dielectric material layer; a plurality of first conductive blocks formed on the first wiring layer; a second dielectric material layer covering the second surface of the first dielectric material layer and the first wiring layer and encapsulating the first conductive blocks, with terminal portions of the first conductive blocks exposed from the second dielectric material layer; a second wiring layer formed on the second dielectric material layer and electrically connected with the first conductive blocks; and a plurality of second conductive blocks formed on the second wiring layer.

In summary, the present invention provides an interposer substrate and a method of fabricating the same, which are characterized by forming recessed grooves on a carrier by an etching method, with a first dielectric material layer formed in the recessed grooves, forming a patterned first dielectric material layer on the carrier, forming a first wiring layer, first conductive blocks, and a second dielectric material layer on the carrier and the first dielectric material layer, with the first wiring layer and first conductive blocks embedded in the second dielectric material layer, and forming second wiring layer and second conductive blocks on the second dielectric material layer, to form a coreless interposer substrate having and fine pitches, so as to meet the low-profile and compact-size requirements. In addition, the present invention also solves the problem that the design limitation due to line width/line space (L/S) in prior art. Besides only a portion of the first wiring layer is exposed, for mounting and electrically connecting the external electronic elements, without a need of disposing an insulating layer (solder mask layer), as well as any additional conductive layer, as a result the fabricating process is simplified and the cost is reduced.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "on", "first", "second" and "top", "bottom" and etc., are merely for illustrative purpose and should not be construed to limit the scope of the present invention.

FIGS. 3A-3K are schematic cross-sectional views of an interposer substrate according to a first embodiment of the present invention.

Figure 1:
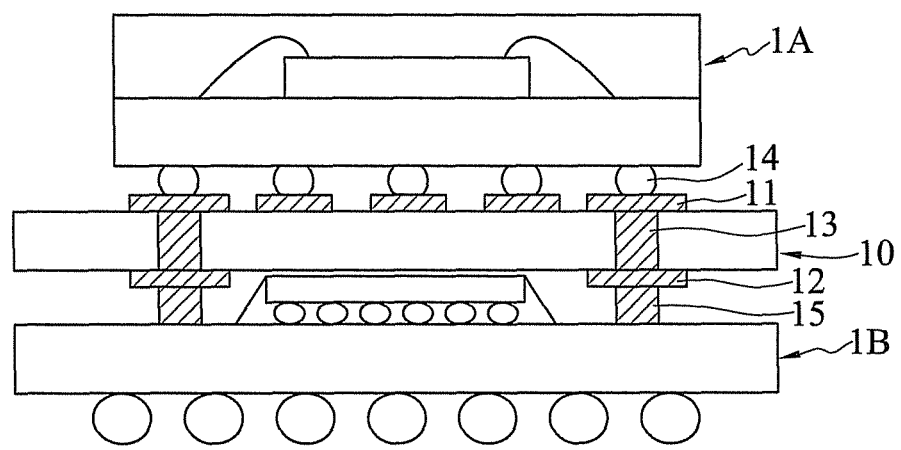
FIG. 1 is a schematic cross-sectional view showing a conventional stacked package structure.
Figure 2A:
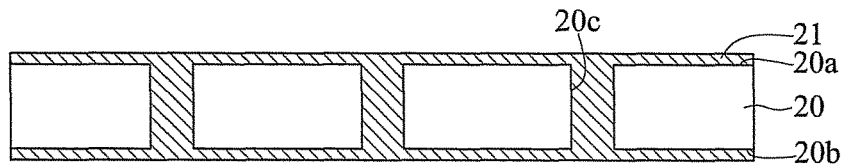
FIGS. 2A-2E are schematic cross-sectional views showing a conventional interposer substrate.
Figure 2B:
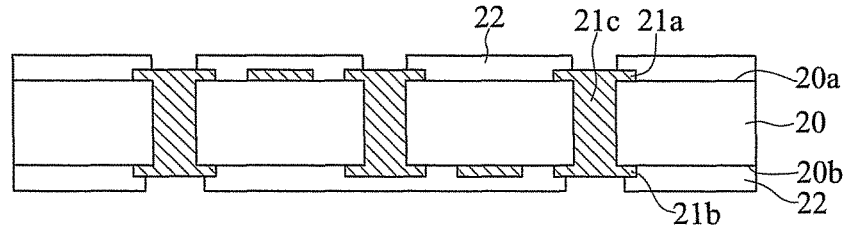
Figure 2C:
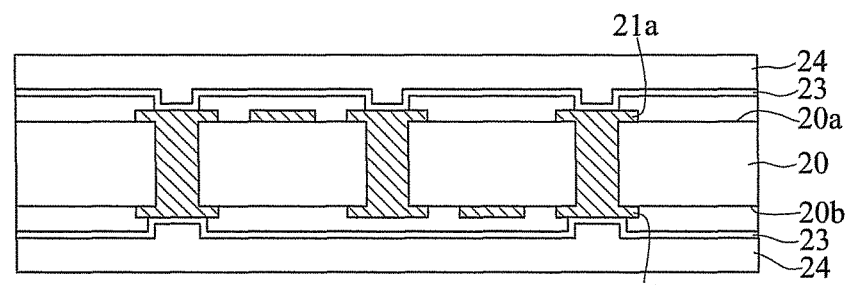
Figure 2D:
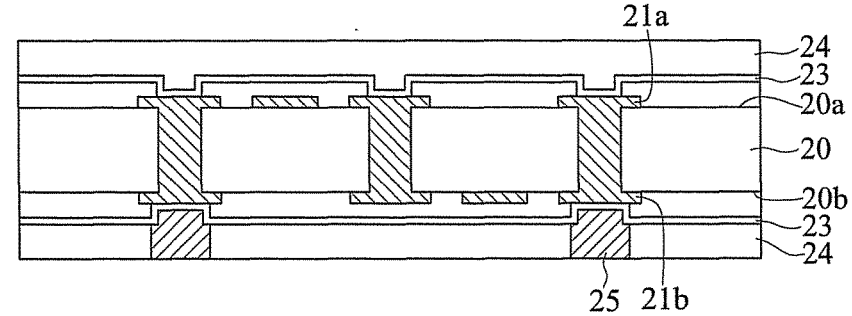
Figure 2E:
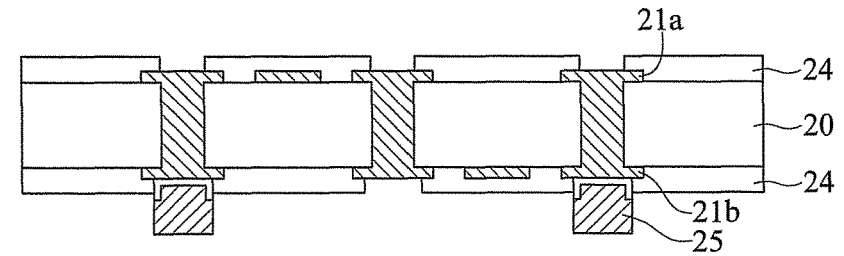
Figure 3A:
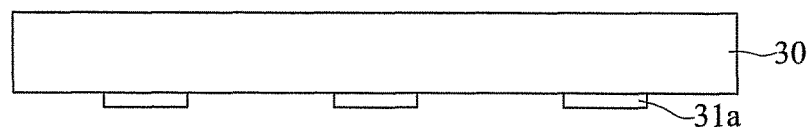
FIGS. 3A-3K are schematic cross-sectional views showing an interposer substrate in accordance with a first embodiment of the present invention.

As shown in FIG. 3A, a carrier 30 and a first resist layer 31 covering the carrier 30 are provided. A pattering process is performed on the first resist layer 31a to forming a plurality of openings for exposing the carrier 30. The carrier 30 is, but not limited to, a substrate such as a copper foil substrate.

Figure 3B:
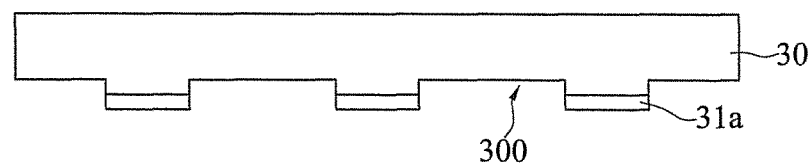

As shown in FIG. 3B, an etching method is performed to remove a portion of the carrier 30 covered by the first resist layer 31a, to form a plurality of recessed grooves 300 on the carrier 30.

Figure 3C:
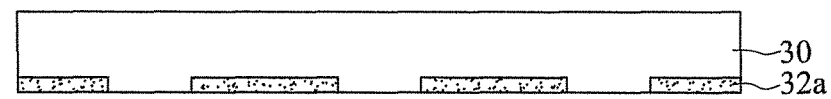

As shown in FIG. 3C, the first resist layer 31a is removed and the recessed grooves 300 are filled with a dielectric material, so as to form a first dielectric material layer 32a. The first dielectric material layer can be formed in the recessed grooves 300 via a molding, a coating, or a lamination method. The dielectric material can be epoxy resin for instance.

Figure 3D:
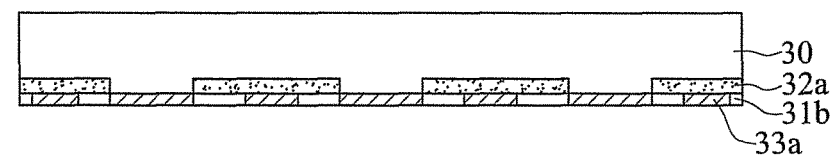

As shown in FIG. 3D, a patterned second resist layer 31b is formed on the carrier 30 and the first dielectric material layer 32a, and the second resist layer 31b has a plurality of openings to expose the first dielectric material layer 32a and a portion of the carrier 30. Subsequently, a first wiring layer 33a is formed in the openings of the second resist layer 31b.

Figure 3E:
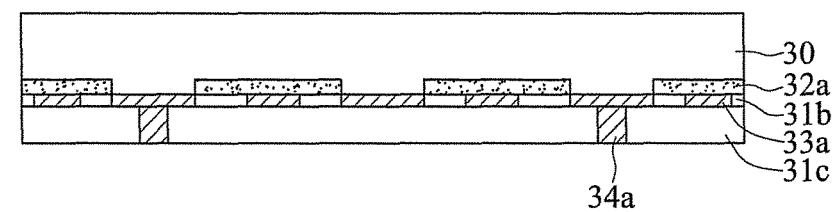

As shown in FIG. 3E, a third resist layer 31c is formed and covers the first wiring layer 33a and the second resist layer 31b, and is patterned to form a plurality of openings on the third resist layer 31c to expose a portion of the first wiring layer 33a. Subsequently, a plurality of first conductive blocks 34a are formed in the openings of the third resist layer 31c.

Figure 3F:
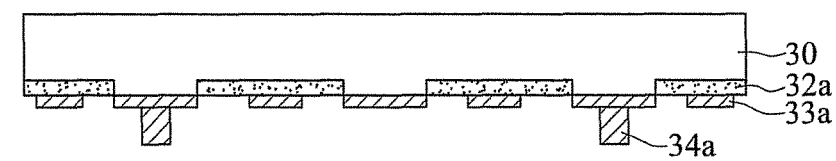

As shown in FIG. 3F, the second resist layer 31b and the third resist layer 31c are removed to expose the first wiring layer 33a and the first conductive blocks 34a.

Figure 3G:
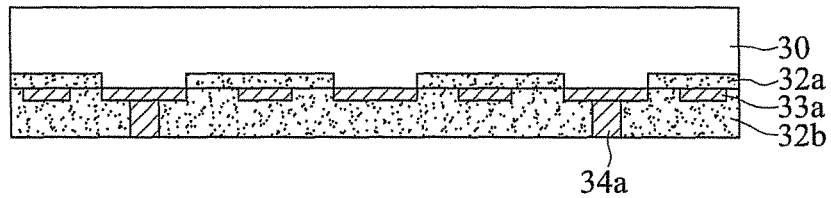

As shown in FIG. 3G, the first dielectric material layer 32a, the first wiring layer 33a and the first conductive blocks 34a are covered with a second dielectric material layer 32b, such that the terminal portions of the first conductive blocks 34a are exposed from the second dielectric material layer 32b.

Figure 3H:
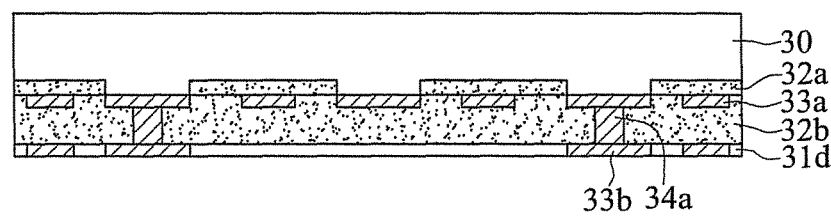

As shown in FIG. 3H, the second dielectric material layer 32b is covered with a fourth resist layer 31d, and the fourth resist layer 31d is patterned to form a plurality of openings for exposing the first conductive blocks 34a and a portion of the second dielectric material layer 32b. A second wiring layer 33b is formed in the openings of the fourth resist layer 31d. The second wiring layer 33b is electrically connected with the first wiring layer 33a via the first conductive blocks 34a.

Figure 3I:
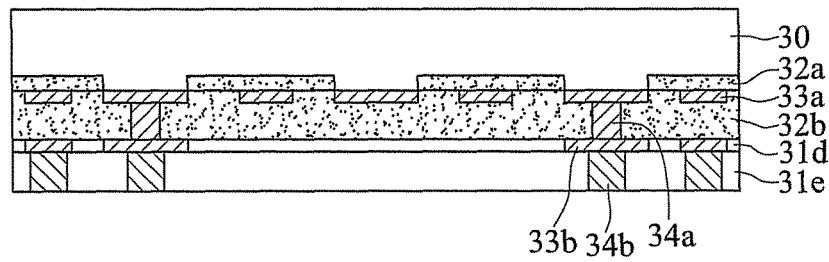

As shown in FIG. 3I, the fourth resist layer 31d and the second wiring layer 33b are covered with a fifth resist layer 31e, and the fifth resist layer 31e is patterned to form a plurality of openings for exposing a portion of the second wiring layer 33b. Second conductive blocks 34b are formed in the openings of the fifth resist layer 31e and electrically connected with the second wiring layer 33b.

Figure 3J:
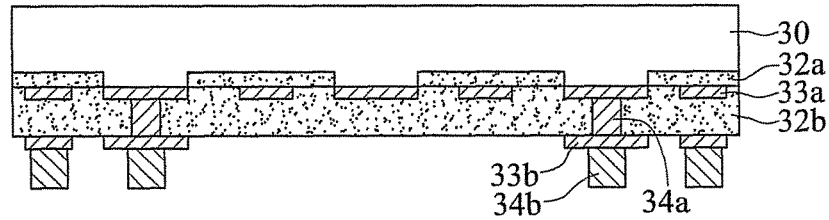

As shown in FIG. 3J, the fifth resist layer 31e and the fourth resist layer 31d are removed, for exposing the second wiring layer 33b and the second conductive blocks 34b.

Figure 3K:
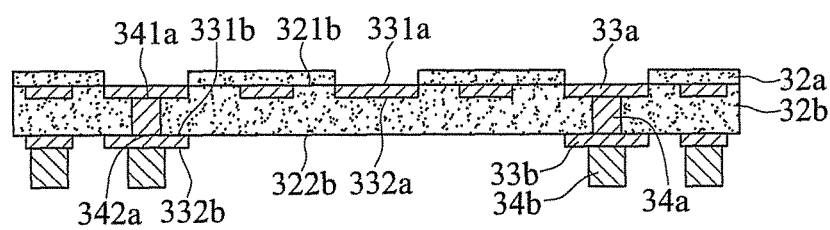

As shown in FIG. 3K, the carrier 30 is removed, to expose a portion of the first wiring layer 33a, so as to complete the fabrication of the interposer substrate according to the present invention. In addition, it is also applicable to etch away the central portion of the carrier, to form a frame-type carrier on the retained first dielectric material layer, to function as a supporting means for the interposer substrate.

Referring to FIG. 3K, the interposer substrate according to the present invention comprises: a first dielectric material layer 32a, a second dielectric material layer 32b, a first wiring layer 33a, a second wiring layer 33b, first conductive blocks 34a, and second conductive blocks 34b.

The second dielectric material layer 32b has a first surface 321b and an opposing second surface 322b.

The first wiring layer 33a has a first surface 331a and an opposing second surface 332a.

The first wiring layer 33a is embedded in the second dielectric material layer 32b, and the first surface 331a of the first wiring layer 33a is flush with the first surface 321b of the second dielectric material layer 32b.

The first dielectric material layer 32a is formed on the first surface 321b of the second dielectric material layer 32b, and the first dielectric material layer 32a has a plurality of openings to expose a portion of the first wiring layer 33a. The partly exposed first wiring layer 33a, such as bonding pads served as an electrical connecting means for electrically connecting external electronic elements (such as semiconductor packages) with the bonding pads via conductive elements such as solder balls. Each of the first conductive blocks 34a has an opposing first terminal portion 341a coupled to the second surface 332a of the first wiring layer 33a, and an opposing second terminal portion 342a flush with the second surface 322b of the second dielectric material layer 32b.

The second wiring layer 33b has a first surface 331b and an opposing second surface 332b. The second wiring layer 33b is formed on the second surface 322b of the second dielectric material layer 32b, and a portion of the first surface 331b of the second wiring layer 33b is coupled to the second terminal portion 342a of the first conductive blocks 34a.

The second conductive blocks 34b are formed on the second surface 332b of the second wiring layer 33b.

Figure 4A:
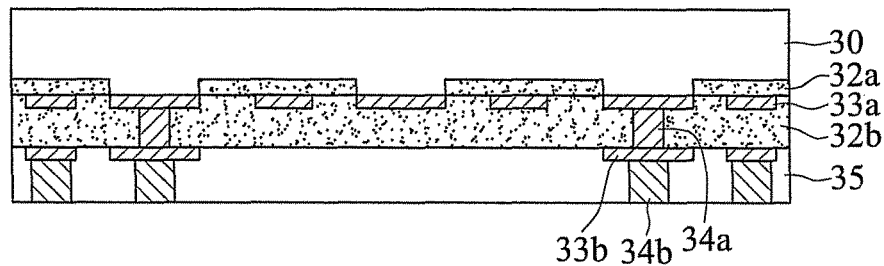
FIGS. 4A and 4B are schematic cross-sectional views showing an interposer substrate in accordance with a second embodiment of the present invention.
Figure 4B:
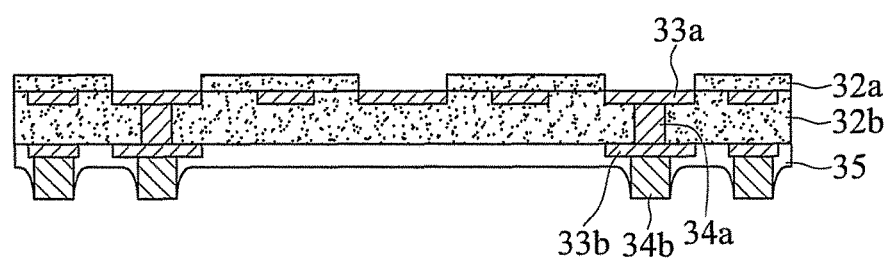

FIGS. 4A-4B are schematic cross-sectional views showing a method of fabricating the interposer substrate in accordance with a second embodiment of the present invention.

As shown in FIG. 4A, after the fifth resist layer and the fourth resist layer are removed to expose the second wiring layer 33b and second conductive blocks 34b corresponding in FIG. 3J, an insulative protection layer 35 is formed to cover the second dielectric material layer 32b, the second wiring layer 33b and the second conductive blocks 34b.

As shown in FIG. 4B, a portion of the insulative protection layer 35 is removed to expose the second conductive blocks 34b, and the carrier 30 is removed to expose the first dielectric material layer 32a and a portion of the first wiring layer 33a.

FIGS. 5A-5I are schematic cross-sectional views showing an interposer substrate in accordance with a third embodiment of the present invention.

Figure 5A:
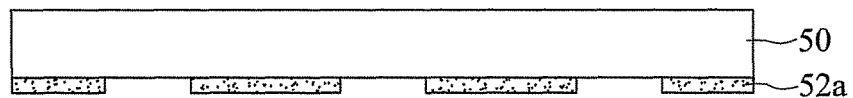
FIGS. 5A-5I' are schematic cross-sectional views showing an interposer substrate in accordance with a third embodiment of the present invention.

As shown in FIG. 5A, a carrier 50 is provided with a patterned first dielectric material layer 52a formed on the surface of the carrier 50, and a plurality of openings are formed on the first dielectric material layer 52a to expose a portion of the carrier 50.

Figure 5B:
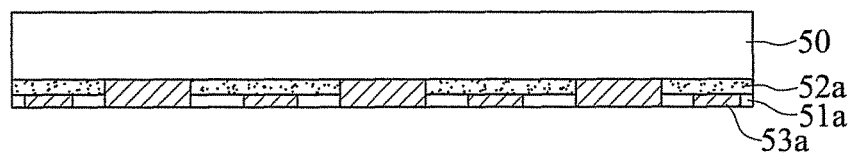

As shown in FIG. 5B, a patterned first resist layer 51a is formed on the carrier 50 and the first dielectric material layer 52a, and a plurality of openings are formed on the patterned first resist layer 51a to expose a portion of the carrier 50 and a portion of the first dielectric material layer 52a. A first wiring layer 53a is formed in the openings of the first resist layer 51a. The openings for exposing the first resist layer correspond in position to the openings of the first dielectric material layer 52a.

Figure 5C:
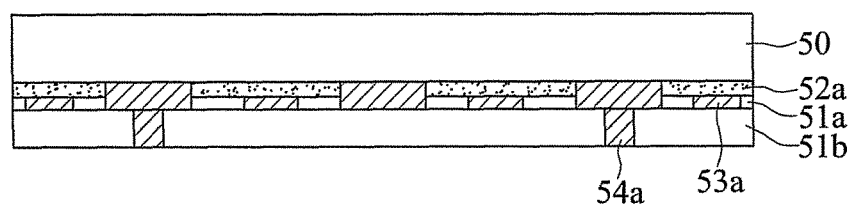

As shown in FIG. 5C, a patterned second resist layer 51b is formed on the first resist layer 51a and the first wiring layer 53a, and has a plurality of openings for exposing a portion of the first wiring layer 53a. First conductive blocks 54a are formed in the openings of the second resist layer 51, and electrically connected with the first wiring layer 53a. The openings of the second resist layer correspond in position to the openings of the first resist layer 51a.

Figure 5D:
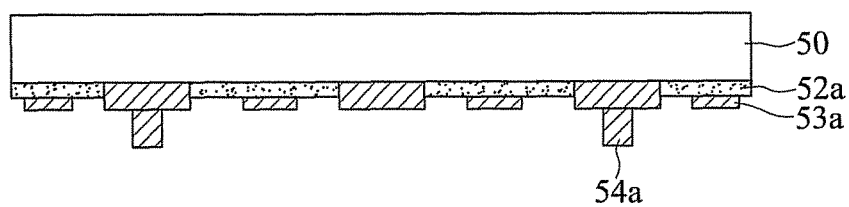

As shown in FIG. 5D, the second resist layer 51b and the first resist layer 51a are removed to expose the first dielectric material layer 52a, the first wiring layer 53a, and the first conductive blocks 54a.

Figure 5E:
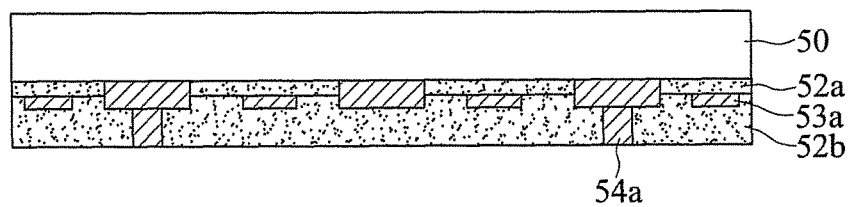

As shown in FIG. 5E, the first dielectric material layer 52a, the first wiring layer 53a, and the first conductive blocks 54a are covered with a second dielectric material layer 52b, with the terminal portions of the first conductive blocks 54a exposed from the second dielectric material layer 52b.

Figure 5F:
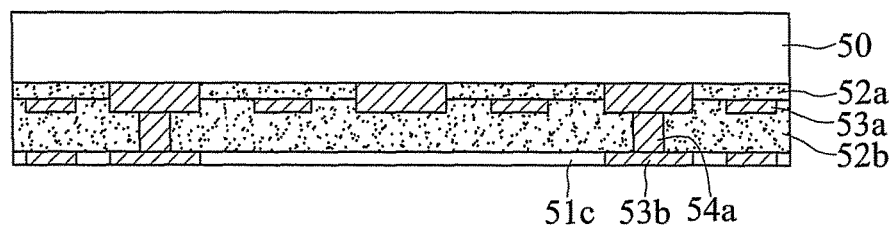

As shown in FIG. 5F, a patterned third resist layer 51c is formed on the second dielectric material layer 52b, and has openings for exposing the first conductive blocks 54a and a portion of the second dielectric material layer 52b. A second wiring layer 53b is formed in the openings of the third resist layer 51c, and electrically connected with the first conductive blocks 54a.

Figure 5G:
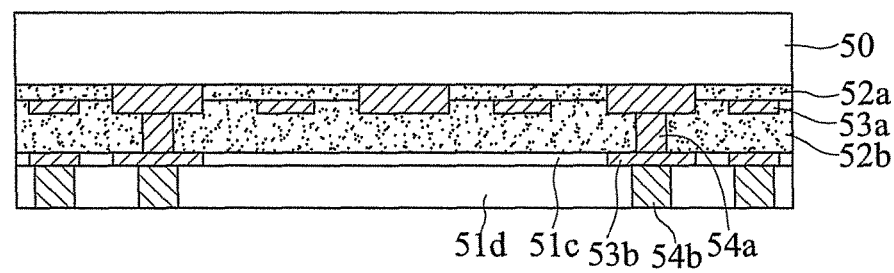

As shown in FIG. 5G, a patterned fourth resist layer 51d is formed on the third resist layer 51c and the second wiring layer 53b, and has a plurality of openings to expose the second wiring layer 53b. Second conductive blocks 54b are formed in the openings of the fourth resist layer 51d, and electrically connected with the second wiring layer 53b.

Figure 5H:
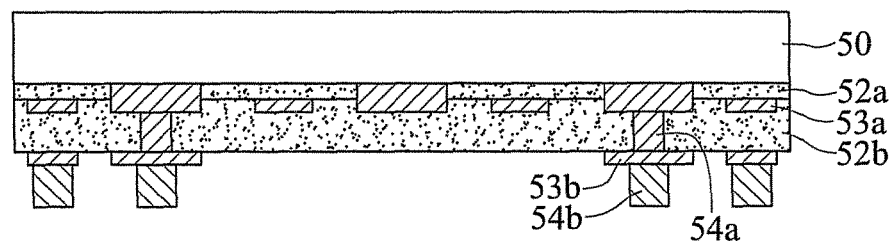

As shown in FIG. 5H, the fourth resist layer 51d and the third resist layer 51c are removed to expose the second wiring layer 53b and second conductive blocks 54b.

Figure 5I:
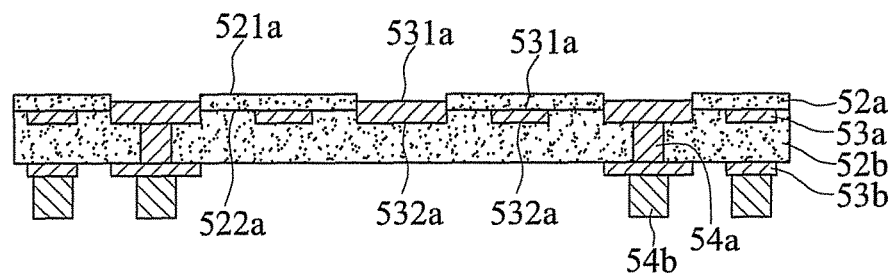
Figure 5I:
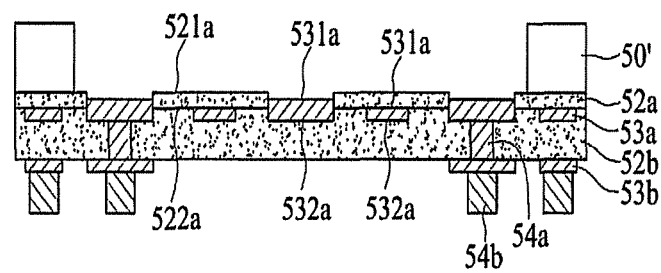

As shown in FIG. 5I, the carrier 50 is removed to expose the first dielectric material layer 52a and a portion of the first wiring layer 53a, so as to complete the fabrication of the interposer substrate according to the present invention. In addition, it is also applicable to etch away the central portion of the carrier 50, to form a frame-type carrier 50' on the remaining first dielectric material layer 52a, to function as a supporting means for the interposer substrate, as shown in FIG. 5I'.

Referring to FIG. 5I, the interposer substrate according to the present invention comprises: a first dielectric material layer 52a, a second dielectric material layer 52b, a first wiring layer 53a, a second wiring layer 53b, first conductive blocks 54a, and second conductive blocks 54b.

The first dielectric material layer 52a has a first surface 521a and an opposing second surface 522a, and a plurality of openings penetrating the first surface 521a and the second surface 522a.

The first wiring layer 53a has a first surface 531a and an opposing second surface 532a. A portion of the first wring layer 53a is formed on the second surface 522a of the first dielectric material layer 52a, and a portion of the first surface 531a is formed in the openings of the first dielectric material layer 52a and is flush with the first surface 521a of the first dielectric material layer 52a. The partly exposed first wiring layer 53a, such as bonding pads served as an electrical connecting means for electrically connecting external electronic elements (such as semiconductor packages) with the bonding pads via conductive elements such as solder balls.

The first conductive block 54a are formed on the second surface 532a of the first wiring layer 53a and electrically connected with the first wiring layer 53a.

The second dielectric material layer 52b covers the second surface 522a of the first dielectric material layer 52a and the second surface 532a of the first wiring layer 53a and encapsulates the first conductive bumps 54a in such a way that the terminal portions of the first conductive bumps 54a are exposed from the second dielectric material layer 52b.

The second wiring layer 353b is formed on the second dielectric material layer 52b, and electrically connected with first conductive blocks 54a.

The second conductive blocks 54b are formed on the second wiring layer 53b.

Figure 6A:
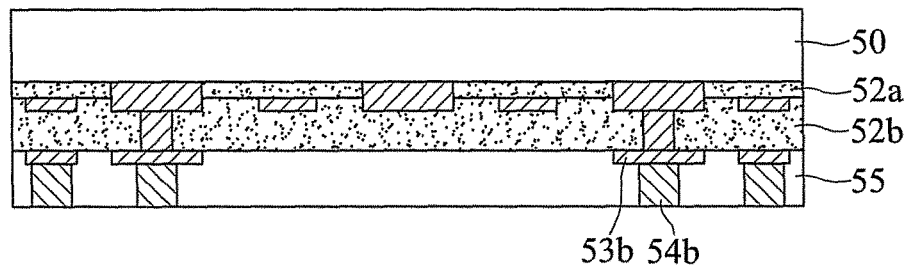
FIGS. 6A and 6B are schematic cross-sectional views showing an interposer substrate in accordance with a fourth embodiment of the present invention.
Figure 6B:
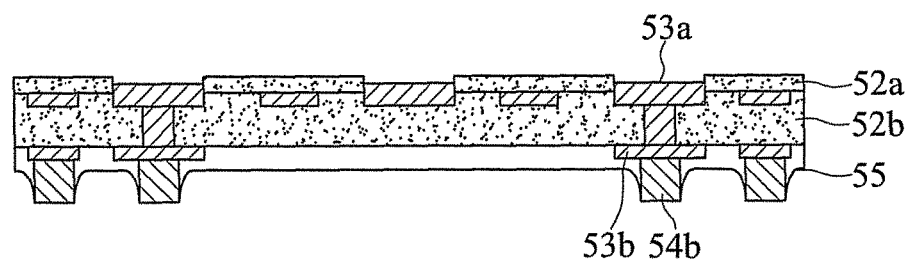

FIGS. 6A-6B are schematic cross-sectional views showing an interposer substrate in accordance with a fourth embodiment of the present invention.

As shown in FIG. 6A, the fourth resist layer and the third resist layer are removed, as did in FIG. 5H, to expose the second wiring layer 54b, and the carrier 50 is removed to expose the first dielectric material layer 52a and a portion of the first wiring layer 53a.

In summary, the present invention provides an interposer substrate and a method of fabricating the same, which are characterized by forming recessed grooves on a carrier by an etching method, with a first dielectric material layer formed in the recessed grooves, forming a patterned first dielectric material layer on the carrier, forming a first wiring layer, first conductive blocks, and a second dielectric material layer on the carrier and the first dielectric material layer, with the first wiring layer and first conductive blocks embedded in the second dielectric material layer, and forming a second wiring layer and second conductive blocks on the second dielectric material layer, to form a coreless interposer substrate having and fine pitches, so as to meet the low-profile and compact-size requirements. In addition, the present invention also solves the problem that the design limitation due to line width/line space (L/S) in prior art. Besides only a portion of the first wiring layer is exposed, for mounting and electrically connecting the external electronic elements, without a need of disposing an insulating layer (solder mask layer), as well as any additional conductive layer, as a result the fabricating process is simplified and the cost is reduced.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An interposer substrate, comprising:
   a first dielectric material layer having opposing first and second surfaces and a plurality of openings penetrating the first and second surfaces;
   a first wiring layer having a first portion formed on the second surface of the first dielectric material layer and a second portion formed in the openings of the first dielectric material layer and exposed from the first surface of the first dielectric material layer;
   a plurality of first conductive blocks formed on the first wiring layer;
   a second dielectric material layer covering the second surface of the first dielectric material layer and the first wiring layer and encapsulating the first conductive blocks, with terminal portions of the first conductive blocks exposed from the second dielectric material layer, wherein the second dielectric material layer is free from being covered by a solder mask layer;
   a second wiring layer formed on and free from being encapsulated by the second dielectric material layer and electrically connected with the first conductive blocks; and
   a plurality of second conductive blocks made of copper and formed on the second wiring layer and free from being encapsulated by the second dielectric material layer and the solder mask layer.

2. The interposer substrate of claim 1, further comprising a frame-type carrier formed on the first surface of the first dielectric material layer.

3. The interposer substrate of claim 1, wherein the second portion of the first wiring layer that is exposed from the first dielectric material layer serves as bonding pads, for an external electronic component to be disposed on and electrically connected with the bonding pads via a plurality of conductive elements.

* * * * *